(12) United States Patent
Song et al.

(10) Patent No.: US 10,944,078 B2
(45) Date of Patent: Mar. 9, 2021

(54) ORGANIC LIGHT EMITTING DIODE AND METHOD OF MANUFACTURING THE SAME

(71) Applicant: LG Display Co., Ltd., Seoul (KR)

(72) Inventors: Taejoon Song, Paju-si (KR); Jongmin Kim, Pyeongtaek-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/600,862

(22) Filed: Oct. 14, 2019

(65) Prior Publication Data

US 2020/0044196 A1 Feb. 6, 2020

Related U.S. Application Data

(63) Continuation of application No. 16/030,287, filed on Jul. 9, 2018, now Pat. No. 10,483,495.

(30) Foreign Application Priority Data

Jul. 11, 2017 (KR) ........................ 10-2017-0088076

(51) Int. Cl.
*H01L 51/52* (2006.01)
*H01L 27/32* (2006.01)
*H01L 51/56* (2006.01)

(52) U.S. Cl.
CPC ...... *H01L 51/5268* (2013.01); *H01L 27/3202* (2013.01); *H01L 51/5206* (2013.01); *H01L 51/5228* (2013.01); *H01L 51/5275* (2013.01); *H01L 51/56* (2013.01); *H01L 51/5212* (2013.01); *H01L 2251/5361* (2013.01)

(58) Field of Classification Search
CPC ............ H01L 51/5268; H01L 51/5212; H01L 51/5228; H01L 27/3202
See application file for complete search history.

(56) References Cited

U.S. PATENT DOCUMENTS

| 8,049,217 | B2 | 11/2011 | Sung et al. |
| 10,074,823 | B2 | 9/2018 | Kang et al. |
| 10,158,096 | B2 | 12/2018 | Lee et al. |

(Continued)

FOREIGN PATENT DOCUMENTS

| CN | 103050369 A | 4/2013 |
| CN | 103887441 A | 6/2014 |

(Continued)

*Primary Examiner* — Phat X Cao
(74) *Attorney, Agent, or Firm* — Seed Intellectual Property Law Group LLP

(57) ABSTRACT

A lighting device is provided. The lighting device may include an organic light emitting diode arranged on one surface of a first substrate, the organic light emitting diode including a first electrode, an organic light emitting layer and a second electrode, and the first electrode is made of a transparent conductive material having a resistance value of 2,800-5,500Ω in each pixel, and has light scattering particles dispersed therein. Thus, even when a resistor of the organic light emitting layer is removed from a pixel due to a contact between the first electrode and the second electrode, it is possible to prevent an over current from being applied to the corresponding pixel through a resistor of the first electrode.

5 Claims, 9 Drawing Sheets

(56) References Cited

U.S. PATENT DOCUMENTS

| | | | |
|---|---|---|---|
| 2002/0011783 A1* | 1/2002 | Hosokawa | H05B 33/12 313/504 |
| 2004/0217702 A1 | 11/2004 | Garner et al. | |
| 2007/0114523 A1* | 5/2007 | Oumi | B82Y 20/00 257/40 |
| 2009/0252967 A1 | 10/2009 | Yoon et al. | |
| 2010/0060142 A1* | 3/2010 | Itou | B82Y 20/00 313/498 |
| 2012/0080668 A1* | 4/2012 | Seki | H01L 51/5268 257/40 |
| 2014/0168778 A1 | 6/2014 | Chen et al. | |
| 2015/0364724 A1* | 12/2015 | Kim | H01L 51/56 257/40 |

FOREIGN PATENT DOCUMENTS

| | | |
|---|---|---|
| CN | 105742510 A | 7/2016 |
| CN | 106463642 | 2/2017 |
| CN | 106575662 A | 4/2017 |
| JP | 2014-82191 A | 5/2014 |
| KR | 10-2015-0132032 A | 11/2015 |

* cited by examiner

ORGANIC LIGHT EMITTING DIODE AND METHOD OF MANUFACTURING THE SAME

CROSS-REFERENCE TO RELATED APPLICATION

This application is a continuation of U.S. patent application Ser. No. 16/030,287, filed Jul. 9, 2018, which claims the priority of Korean Patent Application No. 10-2017-0088076 filed on Jul. 11, 2017, in the Korean Intellectual Property Office, the disclosures of which applications are hereby incorporated by reference in their entireties.

BACKGROUND

Technical Field

The present disclosure relates to a lighting device which may prevent defects resulting from a short-circuit and improve light extraction efficiency, and a method of manufacturing the same.

Description of the Related Art

Currently, a fluorescent lamp or an incandescent lamp is mainly used as a lighting device. In the case of the incandescent lamp, a color rendering index is high, but energy efficiency is very low. Conversely, in the case of the fluorescent lamp, the energy efficiency is high, but the color rendering index is low. Further, the fluorescent lamp contains mercury, which causes environmental problems.

In order to solve the problems of the conventional lighting device, a light emitting diode (LED) based lighting device has been proposed. The LED, which is formed of an inorganic light emitting material, has the highest light emission efficiency at a blue wavelength band and decreasing light emission efficiency toward a red wavelength band and a green wavelength band which has the highest luminosity factor. When the lighting device emits white light output by a combination of a red LED, a green LED and a blue LED, the light emission efficiency is lowered. Also, when using the red, green and blue LEDs, each emission peak has a narrow width, so that a color rendering property also deteriorates.

In order to solve these problems, a lighting device to output white light by combining the blue LED and a yellow phosphor instead of combining the red, green and blue LEDs has been proposed. Because it is more efficient to use the blue LED having higher light emission efficiency than the green LED having low light emission efficiency, and for the other colors to use a fluorescent material that receives blue light to emit yellow light.

However, even though the lighting device outputs white light by combining the blue LED and the yellow phosphor, the fluorescent material itself that emits yellow light has a poor light emission efficiency, and thus there is a limitation in improving the light emission efficiency of the lighting device.

In order to solve the problem of a decrease in the light emission efficiency as described above, a lighting device using an organic light emitting diode formed of an organic light emitting material has been proposed. In general, green and red colors of the organic light emitting diode each have relatively higher light emission efficiency than those of an inorganic light emitting diode. Further, blue, green and red colors of the organic light emitting diode each have a relatively wider emission peak than those of the inorganic light emitting diode, and thus the organic lighting device has an improved color rendering property, and as a result, light produced from the lighting device including the organic light emitting diode is more similar to sunlight.

The organic light emitting diode includes an anode, a cathode, and an organic light emitting layer arranged therebetween. However, the organic light emitting diode used for a lighting device is likely to have problems such as, for example, pinholes and cracks resulting from penetration of impurities, steps in an internal structure of the organic light emitting diode, and roughness of laminated layers since an interval between the anode and the cathode is short. Such problems cause the anode and the cathode to be in a direct contact with each other, and as a result, the anode and the cathode may be short-circuited. Further, the organic light emitting layer may be formed to have a thickness thinner than a predetermined thickness due to a process failure, a process error, or the like, and as a result, the anode and the cathode may be electrically short-circuited.

When the anode and the cathode are short-circuited, a short-circuit region forms a low resistance path that allows a current flow, and thus the current flows only into the short-circuit region and a current flowing through the other region of the organic light emitting diode is greatly reduced or does not flow at all in an extreme case. As a result, the light emission efficiency of the organic light emitting diode is reduced, or the organic light emitting diode does not emit light.

When such an organic light emitting diode is applied to a lighting device, the lighting device outputs light less than a predetermined luminance due to the short-circuit of the anode and the cathode, so that the quality of the lighting device may be lowered or even the lighting device may not be operated. Also, when the organic light emitting diode is applied to a display device, a pixel corresponding to a region short-circuited by the short-circuit may have a defect, and as a result the quality of the display device may be deteriorated.

Generally, since the organic light emitting diode is manufactured in a clean room, it is possible to reduce the occurrence of a short-circuit of the anode and cathode of the organic light emitting diode resulting from the penetration of impurities such as, for example, dust, and the like during the manufacturing process. However, practically, it is not possible to completely prevent the penetration of the impurities even in a clean room, and it is not possible to prevent the occurrence of a short-circuit resulting from a structural problem such as, for example, steps of an internal structure of the organic light emitting diode and roughness of laminated layers. As a result, it is not possible to completely prevent a defect resulting from the short-circuit.

BRIEF SUMMARY

Embodiments disclosed herein provide a lighting device which may prevent a short-circuit resulting from the contact between a first electrode and a second electrode by forming the first electrode of an organic light emitting diode from a high resistance transparent conductive material having a resistance value higher than a predetermined value, and a method of manufacturing the same.

Embodiments disclosed herein also provide a lighting device which may improve light extraction efficiency by incorporating light scattering particles into the first electrode and scattering light output from the organic light emitting diode at the first electrode, and a method of manufacturing the same.

According to embodiments disclosed herein, the lighting device may include a first substrate and an organic light emitting diode arranged on the first substrate, the organic light emitting diode including a first electrode, an organic light emitting layer and a second electrode, and the first electrode may be formed of a transparent conductive material having a resistance value of 2,800-5,500Ω in each pixel. Thus, even when a resistor of the organic light emitting layer is removed from a pixel due to the contact between the first electrode and the second electrode, it is possible to prevent an over current from being applied to the corresponding pixel through a resistor of the first electrode.

A plurality of pixels of the first substrate may be partitioned by an auxiliary electrode connected to the first electrode. The auxiliary electrodes may be arranged in a matrix shape, a mesh shape, an octagonal shape, a hexagonal shape, or a circular shape with a predetermined width.

The first electrode may be formed of a conductive polymer such as, for example, poly (3,4-ethylenedioxythiophene):polystyrenesulfonic acid (PEDOT:PSS), a carbon based material such as, for example, graphite, a single wall carbon nano tube (SWCNT), a multi wall carbon nano tube (MWCNT), and a nanowire based material such as, for example, Cu-nanowires, Ag-nanowires, and Au-nanowires.

It is possible to reduce a refractive index difference at an interface between the first electrode and the first substrate by incorporating light scattering particles having a high refractive property such as, for example, $TiO_2$, $BaTiO_3$, $ZrO_2$, $ZnO$, $SiO_2$ and $SiO$ into the first electrode, thereby improving the extraction efficiency of light output to the outside of the lighting device.

The lighting device according to embodiments may be manufactured by incorporating the light scattering particles having a high refractive index into a high resistance conductive material having a resistance value of 2,800-5,500Ω in each pixel, forming a first electrode from the high resistance conductive material, and forming an organic light emitting layer and a second electrode thereon.

The step of forming the high resistance conductive material may include: melting a conductive material in 80-90 wt. % of a solvent; mixing the molten conductive material with a binder; attaching an addictive to the molten conductive material; and incorporating light scattering particles having a high refractive index into the molten conductive material. The solvent may include water or alcohol; the conductive material may include a conductive polymer, a carbon based material, or a nanowire based material; the binder may include a silicon based binder or an acrylic binder; and the additive may include a leveler or a surfacer.

According to one or more embodiments, the first electrode of the organic light emitting diode may be formed of a transparent conductive material having high resistance to prevent the organic light emitting diode from being short-circuited even when the first electrode and the second electrode of the organic light emitting diode are in contact with each other, thereby preventing the luminance of the lighting device from being lowered or the lighting device from becoming inoperable due to the over current being applied to the pixel where the contact occurs.

In particular, it is possible to prevent the occurrence of a short-circuit due to the contact between the first electrode and the second electrode without forming a separate resistive layer or a resistive pattern, thereby preventing a manufacturing process from being complicated and an aperture ratio from being lowered.

In addition, the light scattering particles may be dispersed in the first electrode to minimize light loss between the first electrode and the first substrate, thereby improving the light efficiency and power efficiency of the lighting device.

DETAILED DESCRIPTION

Hereinafter, embodiments according to embodiments will be described in detail with reference to the accompanying drawings.

The present disclosure provides a lighting device including an organic light emitting diode formed of an organic material, not a lighting device including an inorganic light emitting diode formed of an inorganic material.

Green and red colors of the organic light emitting diode each have relatively higher light emission efficiency than those of an inorganic light emitting diode. Further, blue, green and red colors of the organic light emitting diode each have a relatively wider emission peak than those of the inorganic light emitting diode, and thus the organic lighting device has an improved color rendering property, and as a result, light emitted from the lighting device including the organic light emitting diode is more similar to sunlight.

In particular, the present disclosure provides a lighting device including an organic light emitting diode capable of preventing a decrease in light emission efficiency or no light emission when some pixels of the organic lighting emitting device are short-circuited.

Figure 1:
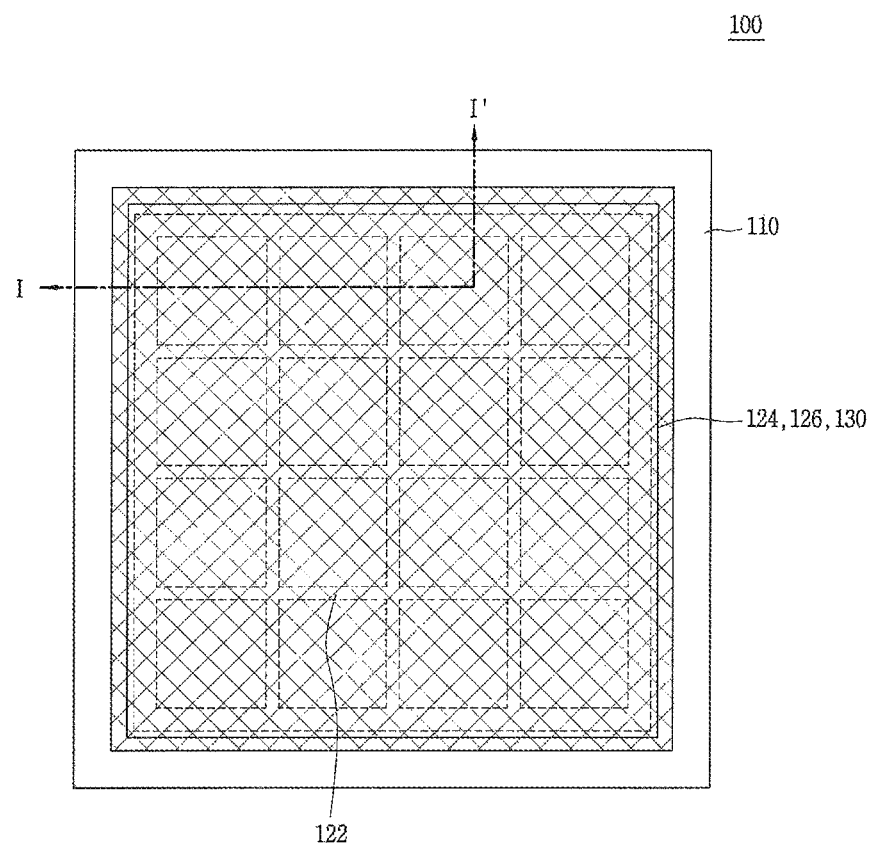
FIG. 1 is a plan view showing a structure of a lighting device according to an embodiment.

FIG. 1 shows a structure of a lighting device using an organic light emitting diode according to a first embodiment.

As shown in FIG. 1, a lighting device 100 according to embodiments, which is a surface lighting device, may include an organic light emitting diode which is formed of a first electrode 124 and a second electrode 126 arranged over the entire surface of a first substrate 110, and an organic light emitting layer 130 arranged between the first electrode 124 and the second electrode 126. The organic light emitting layer 130 may emit light as a signal is applied to the first electrode 124 and the second electrode 126 of the organic light emitting diode, and thereby the lighting device 100 may output light over the entire first substrate 110.

An auxiliary electrode 122 is arranged in a matrix shape on the first substrate 110. The auxiliary electrode 122 is formed of a metal having a high conductivity so that a uniform voltage is applied to the first electrode 124 arranged over the entire region of the first substrate 110, and thereby it is possible for the large-area lighting device 100 to emit light of uniform luminance.

The organic light emitting layer 130 may be formed of an organic light emitting material that outputs white light. For example, the organic light emitting layer 130 may be formed of a blue organic light emitting layer, a red organic light emitting layer, and a green organic light emitting layer, or may have a tandem structure including a blue light emitting layer and a yellow-green light emitting layer. However, the organic light emitting layer 130 according to embodiments is not limited to the above structure, but may have various structures.

In addition, the organic light emitting layer 130 according to embodiments may include an electron injecting layer and a hole injecting layer to respectively inject electrons and holes; an electron transporting layer and a hole transporting layer to respectively transport the injected electrons and holes; and a charge generating layer to generate charges such as the electrons and the holes.

Although not shown in the drawings, a first pad and a second pad, which are respectively connected to the first electrode 124 and the second electrode 126 to receive a voltage from the outside, may be arranged on the first substrate 110. Here, the first and second pad may be arranged in an edge region of one side of the first substrate 110, or in edge regions of both sides of the first substrate 110. Also, a plurality of the first pads and second pads may be arranged in edge regions of four sides of the first substrate 110.

Figure 2:
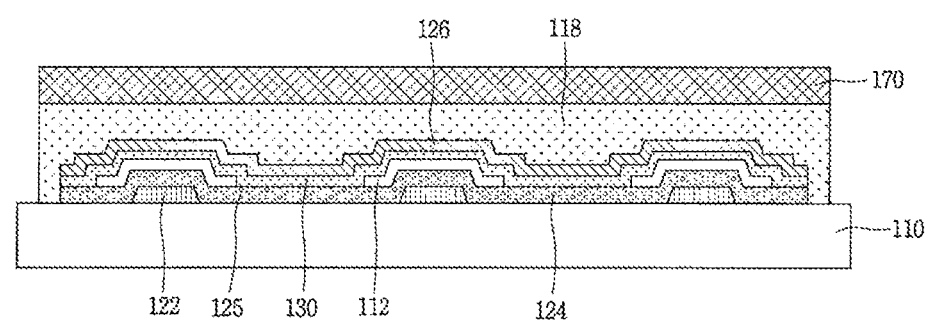
FIG. 2 is a cross-sectional view taken along line I-I' according to an embodiment.

FIG. 2 is a cross-sectional view taken along the line I-I' of FIG. 1, and the lighting device 100 according to embodiments will be described in more detail with reference to thereto.

As shown in FIG. 2, the first electrode 124 may be arranged on the first substrate 110 formed of a ductile transparent material which may be bent such as, for example, plastic or a rigid transparent material such as, for example, glass. The first electrode 124 may be formed of a transparent conductive material. According to embodiments, the first electrode 124 formed of a transparent conductive material having high resistance may be used. The reason to use such first electrode will be described in detail later. Also, light scattering particles 125 may be dispersed in the first electrode 124.

Although not shown in the drawings, the first and second pads may be arranged in an edge region of the first substrate 110. Here, the first and second pads may be formed of the same material as the first electrode 124 by the same process as the first electrode 124.

The auxiliary electrode 122 may be arranged on the first substrate 110 to be electrically connected to the first electrode 124. The first electrode 124 formed of a transparent conductive material may transmit the emitted light, but may have higher electrical resistance than a metal. Therefore, when the large-area lighting device 100 is manufactured, the current applied to a wide lighting region may be dispersed non-uniformly by the high resistance of the transparent conductive material. Such non-uniform current dispersion makes it impossible for the large-area lighting device 100 to emit light of uniform luminance.

The auxiliary electrode 122 may be arranged in a matrix shape, a mesh shape, a hexagonal shape, an octagonal shape, a circular shape, or the like with a narrow width over the entire first substrate 110 so that a uniform voltage is applied to the first electrode 124 arranged over the entire first substrate 110, and thereby it is possible for the large-area lighting device to emit light of uniform luminance.

In the drawings, the auxiliary electrode 122 is arranged under the first electrode 124, but may be arranged on the first electrode 124. The auxiliary electrode 122 may be formed of a metal having a high conductivity such as, for example, Al, Au, Cu, Ti, W, Mo, or an alloy thereof. In the drawings, the auxiliary electrode 122 has a single-layered structure, but may have multi-layered structure having at least two layers.

In addition, the auxiliary electrode 122 may be arranged in a matrix shape to partition the first substrate 110 into a plurality of pixels. In other words, the auxiliary electrode 122 may have much lower resistance than the first electrode 124. Thus, the voltage of the first electrode 124 may not be directly applied to the first electrode 124 through the first pad but may be applied thereto through the auxiliary electrode 122. Accordingly, the first electrode 124 may be divided into a plurality of pixels by the auxiliary electrode 122 although the first electrode is formed over the entire first substrate 110.

The auxiliary electrode 122 may be formed to have a width of about 40-60 μm, but the width of the auxiliary electrode 122 may be varied according to various factors such as, for example, a type of the metal used, an area of the lighting device 100, a size of the pixel, and the like.

A protective layer 112 may be laminated on the first electrode 124 of the first substrate 110. The protective layer 112 is configured to cover the auxiliary electrode 122 and the first electrode 124 arranged thereon. Since the auxiliary electrode 122 is formed of an opaque metal, no light is output to the region where the auxiliary electrode 122 is formed. Therefore, the protective layer 112 may be arranged only on the auxiliary electrode 122 and may not be arranged in an actual light emitting region (i.e., pixel) so that light is emitted only in the light emitting region of the pixel.

Also, the protective layer 112 may be formed to surround the auxiliary electrode 122 so as to reduce steps resulting from the auxiliary electrode 122, so that the various layers to be formed thereafter is stably formed without being disconnected.

The protective layer 112 may be formed of an inorganic layer such as, for example, SiOx or SiNx. However, the protective layer 112 may be formed of an organic layer such as, for example, photo-acryl, or may be formed of a plurality of layers of an inorganic layer and an organic layer.

The organic light emitting layer 130 and the second electrode 126 may be arranged on first electrode 124 and the protective layer 112.

The organic light emitting layer 130 may be formed of a red light emitting layer, a blue light emitting layer and a green light emitting layer, or may have a tandem structure including a blue light emitting layer and a yellow-green light emitting layer. In addition, the organic light emitting layer 130 may include an electron injecting layer and a hole injecting layer to respectively inject electrons and holes; an electron transporting layer and a hole transporting layer to respectively transport the injected electrons and holes; and a charge generating layer to generate charges such as the electrons and the holes.

The organic light emitting layer 130 may include a material that emits light in a visible light region by receiving holes and electrons from the hole transporting layer and the electron transporting layer, respectively, and combining them. Here, it is preferable to use an organic material having high quantum efficiency for fluorescence or phosphorescence. As the organic material, 8-hydroxy-quinoline aluminum complex (Alq3), carbazole-based compounds, dimerized styryl compounds, BAlq, 10-hydroxybenzoquinoline-(P-phenylenevinylene) (PPV), and the like may be used, but the organic material is not limited thereto.

Also, the second electrode 126 may be formed of metal such as, for example, Ca, Ba, Mg, Al and Ag, or an alloy thereof. Although not shown in the drawing, a second pad, which is connected to the second electrode 126 to apply a voltage to the second electrode 126, may be provided on an outer region of the first substrate 110.

The first electrode 124, the organic light emitting layer 130, and the second electrode 126 may constitute the organic light emitting diode. Here, when a voltage is applied to the first electrode 124 that is an anode of the organic light emitting diode and the second electrode 126 that is a cathode of the organic light emitting diode, an electron and a hole are respectively injected from the second electrode 126 and the first electrode 124 into the organic light emitting layer 130 to generate an exciton in the organic light emitting layer 130. As the exciton decays, light corresponding to an energy difference between a lowest unoccupied molecular orbital (LUMO) and a highest occupied molecular orbital (HOMO) is generated and emitted in a lower direction (a direction toward the substrate 110 in the drawing).

Since the protective layer 112 may be arranged on the auxiliary electrode 122, the organic light emitting layer 130 arranged on the auxiliary electrode 122 may not be in direct contact with the first electrode 124. As a result, the organic light emitting diode may not be formed on the auxiliary electrode 122. In other words, the organic light emitting diode in a light emitting region may be formed only in a pixel between the auxiliary electrodes 122 formed in a matrix shape.

An adhesive 118 may be applied onto the first substrate 110 provided with the organic light emitting diode. A second substrate 170 may be arranged on the first substrate 110 coated with the adhesive, and the second substrate may be attached to first substrate 110 by the adhesive to seal the lighting device 100. The adhesive 118 may be a photo-curable adhesive or a thermo-curable adhesive. The second substrate 170 may be formed of various materials. As shown in the drawings, the adhesive 118 may be also provided on a side surface of the organic light emitting diode so that the organic light emitting diode may be completely sealed.

The second substrate 170 may prevent moisture or air from permeating from the outside, and may be formed of any material as long as it is able to perform a function of preventing the permeation of moisture or air. For example, the second substrate 170 may be formed of a polymer such as polyethyleneterephtalate (PET) or may be formed of a thin metal foil such as aluminum.

Although not shown in the drawing, an upper portion of the second electrode 126 and the side surface of the organic light emitting diode may be provided with a protective layer formed of an organic layer and/or an inorganic layer and a sealant formed of an epoxy compound, an acrylate compound, or an acrylic compound.

The first electrode 124 may be formed of a high resistance transparent conductive material to prevent defects resulting from a short-circuit that occurs upon electrical contact between the first electrode 124 and the second electrode 126.

Figure 3A:
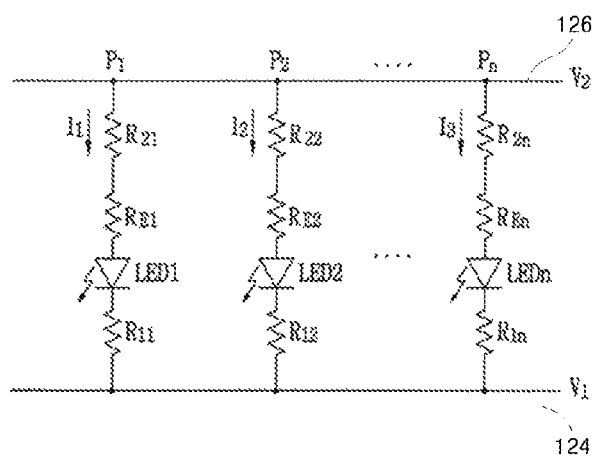
FIG. 3A schematically shows a circuit of an organic light emitting diode provided in a lighting device according to an embodiment.

FIG. 3A schematically shows a circuit of an organic light emitting diode provided in a lighting device. As shown in FIG. 3A, voltages ($V_1$ and $V_2$) are applied to the first electrode 124 and the second electrode 126, respectively. Resistors $R_{E1}, R_{E2} \ldots R_{En}$ of the organic light emitting layer 130, resistors $R_{11}, R_{12} \ldots R_{1n}$ of the first electrode 124, resistors $R_{21}, R_{22} \ldots R_{2n}$ of the second electrode 126 may be connected in series between the first electrode 124 and the second electrode 126.

The organic light emitting diode provided in the lighting device may have a plurality of pixels $P_1, P_2 \ldots P_n$, and the plurality of pixels may be connected to each other in parallel.

In the organic light emitting diode having such a structure, the plurality of pixels may be connected to each other in parallel and the voltages $V_1$ and $V_2$ may be applied to the first electrode 124 and the second electrode 126, respectively. Thereby, currents $I_1, I_2 \ldots I_n$ may be applied to organic light emitting layers $LED_1, LED_2 \ldots LED_n$ of the respective pixels $P_1, P_2 \ldots P_n$, so that the organic light emitting layers $LED_1, LED_2 \ldots LED_n$ each emit light. Each of the organic light emitting layers $LED_1, LED_2 \ldots LED_n$ may be respective portions of the organic light emitting layer 130 which correspond with light emitting regions of the pixels $P_1, P_2 \ldots P_n$. Here, the voltage $V_1$ having a predetermined value may be applied to the first electrode 124, and the second electrode 126 may be grounded.

The plurality of pixels may have substantially the same resistance (the resistance may be different depending on a thickness error between the electrodes 124 and 126, and the organic light emitting layer 130 formed in the respective pixels $P_1, P_2 \ldots P_n$, but the difference is negligible), so that the plurality of pixels may emit light having substantially the same luminance. As a result, the lighting device may output uniform light.

The organic light emitting layer 130 of the organic light emitting diode may be formed to have a thin thickness of several hundred angstroms (Å). When impurities and the like penetrate into the organic light emitting layer 130 due to a process failure, pinholes and cracks occur in the organic light emitting layer 130, and accordingly the first electrode 124 comes in contact with the second electrode 126 through the organic light emitting layer 130. As a result, the first electrode 124 and the second electrode 126 may be short-circuited. Also, various metal layers and insulating layers may be formed under the organic light emitting layer 130. However, steps between the metal layers and the insulating layers may cause cracks in the organic light emitting layer 130, and as a result, the first electrode 124 may be in contact with the second electrode 126. And, the first electrode 124 and the second electrode 126 may be electrically connected to each other since the organic light emitting material is unevenly applied due to a process failure or a process error occurring during the process of laminating the organic light emitting layer 130.

Figure 3B:
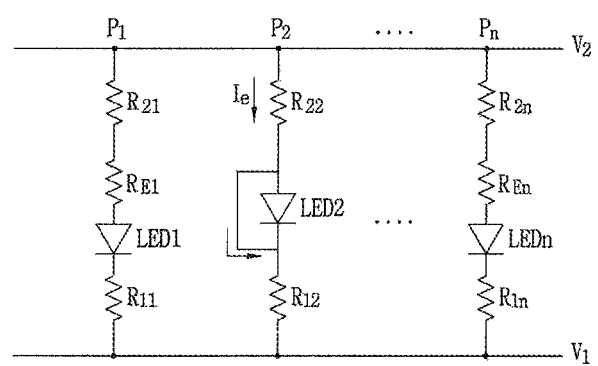
FIG. 3B shows a circuit of an organic light emitting diode when an electrical short-circuit occurs in a first electrode and a second electrode according to an embodiment.

FIG. 3B shows a circuit of an organic light emitting diode when an electrical short-circuit occurs in a first electrode 124 and a second electrode 126.

As shown in FIG. 3B, when the first electrode 124 and the second electrode 126 of one pixel $P_2$ of the plurality of pixels $P_1, P_2 \ldots P_n$ of the organic light emitting diode are in contact with each other or electrically connected to each other, the resistor $R_{E2}$ of the organic light emitting layer 130 may be removed from the corresponding pixel and only the resistors $R_{12}$ and $R_{22}$ of the conductive material of the first electrode 124 and the second electrode 126 may remain therein.

When the first electrode 124 is formed of a transparent metallic oxide material having a relatively high conductivity such as indium tin oxide (ITO) or indium zinc oxide (IZO), the resistors $R_{11}, R_{12} \ldots R_{1n}$ of the first electrode 124 each may have a resistance value of about 20Ω.

The resistors $R_{21}, R_{22} \ldots R_{2n}$ of the second electrode 126 formed of metal each may have a resistance value of about 0.1Ω.

On the other hand, the resistors $R_{E1}, R_{E2} \ldots R_{En}$ of the organic light emitting layer 130 each may have a resistance value of about 1 MΩ. That is, the resistors $R_{E1}, R_{E2} \ldots R_{En}$ of the organic light emitting layer 130 each may have much higher resistance than the resistors $R_{11}, R_{12} \ldots R_{1n}$ of the first electrode 124 and the resistors $R_{21}, R_{22} \ldots R_{2n}$ of the second electrode 126, and thus the total resistance $R_{t1}, R_{t2} \ldots R_{tn}$ of the respective pixels $P_1, P_2 \ldots P_n$ each may have substantially the same resistance to the resistors $R_{E1}, R_{E2} \ldots R_{En}$ of the organic light emitting layer 130 ($R_t \approx R_E$).

Hence, when the first electrode 124 and the second electrode 126 of the second pixel $P_2$ are in contact with each other, and consequently the second pixel $P_2$ is short-circuited, the resistor $R_{E2}$ of the organic light emitting diode of the pixel $P_2$ may be removed and a resistance value of the resistor $R_{E2}$ of the organic light emitting diode may become zero. Thus, the total resistance $R_{t2}$ of the second pixel $P_2$ may have much lower resistance than the total resistances $R_{t1} \ldots R_{tn}$ of the other pixels $P_1 \ldots P_n$ ($R_{t2} \ll R_{t1} \ldots R_{tn}$).

As a result, a current $I_e$ between the first electrode 124 and the second electrode 126 may flow mostly through the short-circuited pixel $P_2$ and the current $I_e$ may hardly flow through the other pixels $P_1 \ldots P_n$. Accordingly, the organic light emitting layers of the pixels $P_1, P_2 \ldots P_n$ each may have sharply lowered luminance or emit no light. As it pertains to this matter, the lighting device may be provided with the auxiliary electrode 122 having a high conductivity, and a signal may be applied to the first electrode 124 of each of the pixels $P_1, P_2 \ldots P_n$ substantially through the auxiliary electrode 122 such that the auxiliary electrode 122 may minimize a current reduction in the other pixels $P_1 \ldots P_n$ even when a particular pixel $P_2$ is short-circuited. But, the other pixels $P_1 \ldots P_n$ may be affected by the short-circuited pixel $P_2$, and the luminance may be lowered over the entire lighting device.

Moreover, the overcurrent $I_e$ may flow to the short-circuited pixel $P_2$, and the temperature of the short-circuited region may rise. As a result, the organic light emitting material of the organic light emitting layer 130 may be degraded.

In order to prevent such defects, the first electrode 124 according to embodiments may be formed of a transparent conductive material having relatively high resistance, so that a separate short-circuit preventing resistor may be provided in each of the pixels $P_1, P_2 \ldots P_n$ of the organic light emitting diode.

Figure 4A:
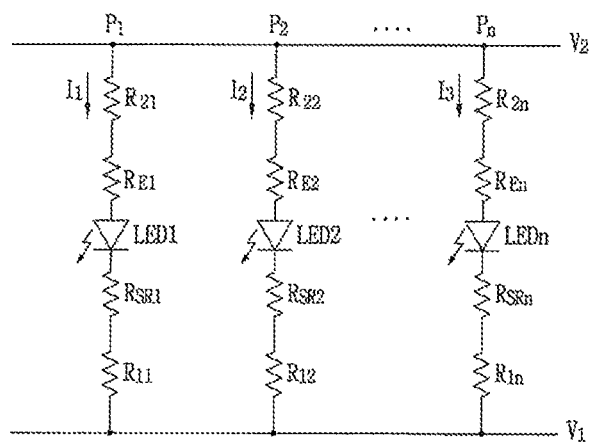
FIGS. 4A and 4B are circuit diagrams of an organic light emitting element having a separate short-circuit preventing resistor according to an embodiment.
Figure 4B:
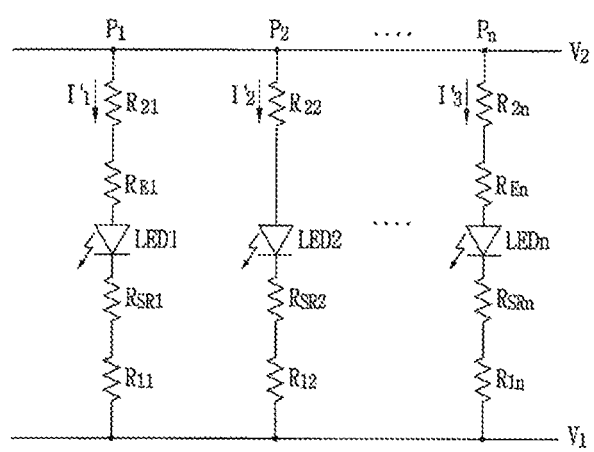

FIGS. 4A and 4B are circuit diagrams of an organic light emitting diode having a separate short-circuit preventing resistor.

As shown in FIG. 4A, short-circuit preventing resistors $R_{SR1}, R_{SR2} \ldots R_{SRn}$ as well as the resistors $R_{E1}, R_{E2} \ldots R_{En}$ of the organic light emitting layer 130, the resistors $R_{11}, R_{12} \ldots R_{1n}$ of the first electrode 124 and the resistors $R_{21}, R_{22} \ldots R_{2n}$ of the second electrode 126 are respectively connected to the plurality of pixels $P_1, P_2 \ldots P_n$ connected to each other in parallel, in serial.

In the organic light emitting diode having such a structure, the voltages $V_1$ and $V_2$ may be applied to the first electrode 124 and the second electrode 126, respectively. Thereby, a current may be applied to the organic light emitting layers $LED_1, LED_2 \ldots LED_n$ of the respective pixels $P_1, P_2 \ldots P_n$, so that the organic light emitting layers $LED_1, LED_2 \ldots LED_n$ each emit light.

The plurality of pixels may have substantially the same resistance, so that the plurality of pixels may emit light having substantially the same luminance. As a result, the lighting device may output uniform light.

As shown in FIG. 4B, when the first electrode 124 and the second electrode 126 of one pixel $P_2$ of the plurality of pixels $P_1, P_2 \ldots P_n$ of the organic light emitting diode are in contact with each other, the resistor $R_{E2}$ of the organic light emitting layer 130 may be removed from the corresponding pixel, and only the resistors $R_{12}$ and $R_{22}$ of the conductive material of the first electrode 124 and the second electrode 126 and the short-circuit preventing resistor $R_{SR2}$ may remain therein.

When the first electrode 124 is formed of a transparent metallic oxide material having a relatively high conductivity such as indium tin oxide (ITO) or indium zinc oxide (IZO), the resistors $R_{11}, R_{12} \ldots R_{1n}$ of the first electrode 124 each may have a resistance value of about 20Ω. Also, the resistors $R_{21}, R_{22} \ldots R_{2n}$ of the second electrode 126 formed of metal each may have a resistance value of about 0.1Ω. On the other hand, the resistors $R_{E1}, R_{E2} \ldots R_{En}$ of the organic light emitting layer 130 each may have a resistance value of about 1 MΩ. Hence, when the short-circuit preventing resistors $R_{SR1}, R_{SR2} \ldots R_{SRn}$ are not provided, the resistors $R_{E1}, R_{E2} \ldots R_{En}$ of the organic light emitting layer 130 each may have much higher resistance than the resistors $R_{11}, R_{12} \ldots R_{1n}$ of the first electrode 124 and the resistors $R_{21}, R_{22} \ldots R_{2n}$ of the second electrode 126, and thus the total resistance $R_{t1}, R_{t2} \ldots R_{tn}$ of the respective pixels $P_1, P_2 \ldots P_n$ each may have substantially the same resistance to the resistors $R_{E1}, R_{E2} \ldots R_{En}$ of the organic light emitting layer 130 ($R_t \approx R_E$).

However, when the respective pixels are provided with the short-circuit preventing resistors $R_{SR1}, R_{SR2} \ldots R_{SRn}$ as shown in the drawings, the total resistance $R_{t1}, R_{t2} \ldots R_{tn}$ of the respective pixels $P_1, P_2 \ldots P_n$ each may not have substantially the same resistance to the resistors $R_{E1}, R_{E2} \ldots R_{En}$ of the organic light emitting layer 130.

When the short-circuit preventing resistors $R_{SR1}, R_{SR2} \ldots R_{SRn}$ are formed to have a resistance value of several tens or less Ω in the same manner as the resistors $R_{11}, R_{12} \ldots R_{1n}$ of the first electrode 124 and the resistors $R_{21}, R_{22} \ldots R_{2n}$ of the second electrode 126, and accordingly they each have much lower resistance than the resistors $R_{E1}, R_{E2} \ldots R_{En}$ of the organic light emitting layer 130, the total resistance $R_{t1}, R_{t2} \ldots R_{tn}$ of the respective pixels $P_1, P_2 \ldots P_n$ each may substantially the same resistance to the resistors $R_{E1}, R_{E2} \ldots R_{En}$ of the organic light emitting layer 130.

However, when the short-circuit preventing resistors $R_{SR1}, R_{SR2} \ldots R_{SRn}$ each have a significant degree of high resistance in comparison to the resistors $R_{E1}, R_{E2} \ldots R_{En}$ of the organic light emitting layer 130, the resistances of the total resistance $R_{t1}$, $R_{t2}$ ... $R_{tn}$ of the respective pixels $P_1$, $P_2$ ... $P_n$ may be substantially the same to the sum of the resistances of the resistors $R_{E1}$, $R_{E2}$ ... $R_{En}$ of the organic light emitting layer 130 and the resistances of the short-circuit preventing resistors $R_{SR1}$, $R_{SR2}$ ... $R_{SRn}$.

Hence, in the event that the respective pixels $P_1$, $P_2$ ... $P_n$ are provided with the short-circuit preventing resistors $R_{SR1}$, $R_{SR2}$ ... $R_{SRn}$ having a predetermined resistance value or more, the resistor $R_{E2}$ of the organic light emitting diode of the pixel $P_2$ may be removed and the resistance value of the resistor $R_{E2}$ of the organic light emitting diode may become zero when the first electrode 124 and the second electrode 126 of the second pixel $P_2$ are in contact with each other. Thus, the total resistance $R_{t2}$ of the second pixel $P_2$ may have substantially the same resistance as the short-circuit preventing resistor $R_{SR2}$ ($R_{t2} \approx R_{SR2}$).

But, the short-circuit preventing resistor $R_{SR2}$ may have a significant degree of resistance rather than very lower resistance in comparison to the resistor $R_{E2}$ of the organic light emitting layer 130. Accordingly, a current between the first electrode 124 and the second electrode 126 may not flow mostly through the pixel $P_2$, but a certain amount of current $I_{2'}$ may flow through the pixel $P_2$. Here, although the amounts of currents flowing through the second pixel $P_2$ and the other pixels $P_1$ ... $P_n$ differ from each other due to a difference in total resistance between the second pixel $P_2$ and the other pixels $P_1$ ... $P_n$ ($I_{2'} \approx I_{1'}$ ... $I_{n'}$), the current may flow through all the pixels $P_1$, $P_2$ ... $P_n$. Thus, it is possible to prevent a phenomenon that the organic light emitting layers of the plurality of pixels $P_1$, $P_2$ ... $P_n$ each have sharply lowered luminance or emit no light.

In particular, even when the first electrode 124 and the second electrode 126 of one pixel of the plurality of pixels $P_1$, $P_2$ ... $P_n$ are in contact with each other, and the pixel is short-circuited, the resistances of the short-circuit preventing resistors $R_{SR1}$, $R_{SR2}$ ... $R_{SRn}$ may be properly set such that a predetermined current rather than an over current flow through the short-circuited pixel. As a result, it is possible to prevent a decrease in the luminance of the organic light emitting diode.

According to embodiments, in the event that the short-circuit preventing resistors $R_{SR1}$, $R_{SR2}$ ... $R_{SRn}$ of the organic light emitting diode formed of the plurality of pixels $P_1$, $P_2$ ... $P_n$ each have a resistance value of about 2,800-5,500Ω, a predetermined current rather than an over current may flow through a specific pixel even when the first electrode 124 and the second electrode 126 of the corresponding pixel are in contact with each other. As a result, all of the pixels $P_1$, $P_2$ ... $P_n$ of the organic light emitting diode may emit light.

Figure 5A:
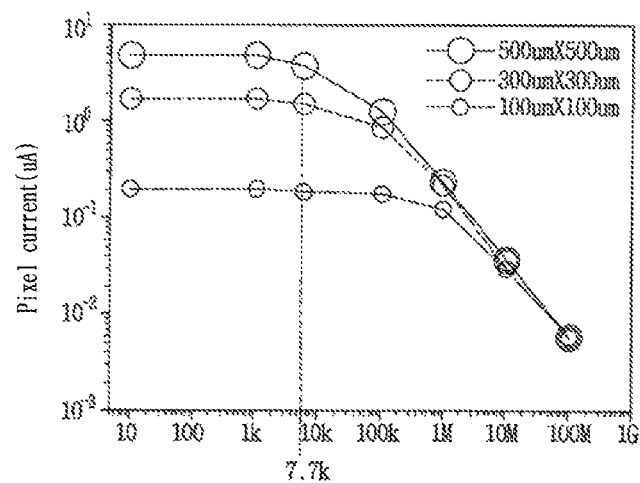
FIG. 5A is a graph showing a relationship between a pixel current and a short-circuit preventing resistor applied to a pixel when a short-circuit does not occur in the pixel of an organic light emitting diode according to an embodiment.
Figure 5B:
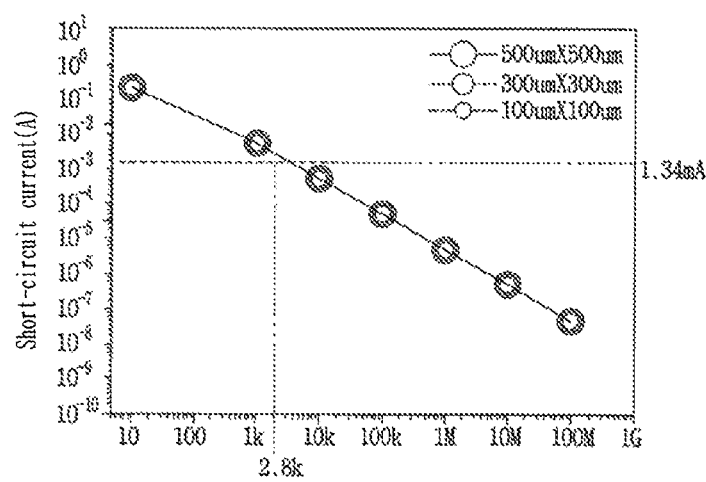
FIG. 5B is a graph showing a relationship between a short-circuit current and a short-circuit preventing resistor applied to a short-circuited pixel when a short-circuit occurs in the pixel of an organic light emitting diode according to an embodiment.

FIG. 5A is a graph showing a relationship between a pixel current and a short-circuit preventing resistor applied to pixels $P_1$, $P_2$ ... $P_n$ when no short-circuit occurs in the pixels $P_1$, $P_2$ ... $P_n$ of the organic light emitting diode. FIG. 5B is a graph showing a relationship between a pixel current and a short-circuit preventing resistor applied to short-circuited pixels $P_1$, $P_2$ ... $P_n$ when a short-circuit occurs in the pixels $P_1$, $P_2$ ... $P_n$ of the organic light emitting diode. FIGS. 5A and 5B show a relationship between a short-circuit preventing resistor and a current when the pixels $P_1$, $P_2$ ... $P_n$ each have sizes of 500×500 μm2, 300×300 μm2 and 100×100 μm2.

As shown in FIG. 5A, when no short circuit occurs in the pixels $P_1$, $P_2$ ... $P_n$ of the organic light emitting diode, the organic light emitting diode is normally operated to emit light over the entire organic light emitting diode. Here, the current required for a normal operation of the organic light emitting diode may vary depending on sizes of the pixels $P_1$, $P_2$ ... $P_n$.

For example, when the organic light emitting diode has a size of 500×500 μm2, a current of about 3.0-5.0 μA is required for a normal operation and light emission of the organic light emitting diode. When the organic light emitting diode has a size of 300×300 μm2, a current of about 1.5-1.8 μA is required for a normal operation and light emission of the organic light emitting diode. When the organic light emitting diode has a size of 100×100 μm2, a current of about 0.19-0.20 μA is required for a normal operation and light emission of the organic light emitting diode.

As shown in FIG. 5A, when the resistances of the short-circuit preventing resistors $R_{SR1}$, $R_{SR2}$ ... $R_{SRn}$ of the respective pixels $P_1$, $P_2$ ... $P_n$ of the organic light emitting diode increase, the pixel currents applied to the pixels $P_1$, $P_2$ ... $P_n$ of the organic light emitting diode may sharply decrease. For example, when the resistances of the short-circuit preventing resistors $R_{SR1}$, $R_{SR2}$ ... $R_{SRn}$ increase to 5,500Ω or more, the currents applied to the pixels $P_1$, $P_2$ ... $P_n$ of the organic light emitting diode having different areas respectively decrease to 3.0 μA or less, 1.5 μA or less and 0.19 μA, resulting in a great decrease in the luminance of the organic light emitting diode. Concisely, when the short-circuit preventing resistors $R_{SR1}$, $R_{SR2}$ ... $R_{SRn}$ of the respective pixels $P_1$, $P_2$ ... $P_n$ of the organic light emitting diode each have a resistance value of 5,500Ω or more, a defect resulting from a decrease in the luminance may occur.

As shown in FIG. 5B, when a short-circuit occurs in the pixels $P_1$, $P_2$ ... $P_n$ of the organic light emitting diode, a short-circuit current is applied to the short-circuited pixel, and as a result, the organic light emitting diode may not operate in a normal manner.

According to embodiments, when the short-circuit current flowing to the short-circuited pixel of the organic light-emitting device exceeds about 1.34 mA, a current applied to the other pixel sharply may decrease due to the over current of the short-circuited pixel, resulting a decrease in the luminance of the entire organic light emitting diode.

As shown in FIG. 5B, when the resistances of the short-circuit preventing resistors $R_{SR1}$, $R_{SR2}$ ... $R_{SRn}$ of the respective pixels $P_1$, $P_2$ ... $P_n$ of the organic light emitting diode decrease, the short-circuit current applied to the short-circuited pixel of the organic light emitting diode may sharply increase. For example, when the resistances of the short-circuit preventing resistors $R_{SR1}$, $R_{SR2}$ ... $R_{SRn}$ decrease to 2,800Ω, the short-circuit current applied to the short-circuited pixel may exceed 1.34 mA, resulting in a decrease in the overall luminance of the organic light emitting diode. When the resistances of the short-circuit preventing resistors $R_{SR1}$, $R_{SR2}$ ... $R_{SRn}$ decrease to 2,800Ω or less, the short-circuit current may further increase and the organic light emitting diode may become inoperable. Concisely, when the short-circuit preventing resistors $R_{SR1}$, $R_{SR2}$ ... $R_{SRn}$ of the short-circuited pixel each have a resistance value of 2,800Ω or less, the organic light emitting diode may become inoperable due to an increase in the short-circuit current.

As described above, when the resistances of the short-circuit preventing resistors $R_{SR1}$, $R_{SR2}$ ... $R_{SRn}$ of the plurality of pixels $P_1$, $P_2$ ... $P_n$ increase to 5,500Ω or more, the luminance of the organic light emitting diode may be greatly lowered. When the resistances of the short-circuit preventing resistors $R_{SR1}$, $R_{SR2}$ ... $R_{SRn}$ of the plurality of pixels $P_1$, $P_2$ ... $P_n$ decrease to 2,800Ω or less, the overall luminance of the organic light emitting diode may be greatly lowered. Accordingly, it is preferable to set the resistances of the short-circuit preventing resistors $R_{SR1}$, $R_{SR2}$ ... $R_{SRn}$ of the plurality of pixels $P_1$, $P_2$ ... $P_n$ in the range of $2,800\Omega \leq R_{SR} \leq 5,500\Omega$.

The short-circuit preventing resistors $R_{SR1}$, $R_{SR2}$ ... $R_{SRn}$ may be configured in various forms. For example, the lighting device having a structure as shown in FIG. 2 may have a resistive layer having a predetermined resistance value, for example, a resistance value of 2,800-5,500Ω, between the first electrode 124 and the organic emission layer 130 and/or the second electrode 126 and the organic emission layer 130 to add the short-circuit preventing resistors $R_{SR1}$, $R_{SR2}$ ... $R_{SRn}$ of the respective pixels $P_1$, $P_2$ ... $P_n$ of the organic light emitting diode. But, since a process for forming a separate resistive layer is added, a manufacturing process may become complicated and a manufacturing cost may become higher. In addition, the organic light emitting diode and the lighting device having the same may be thicker due to the resistive layer.

Also, each pixel of the lighting device 100 having a structure as shown FIG. 1 may have a resistive pattern having a predetermined resistance value to add the short-circuit preventing resistors $R_{SR1}$, $R_{SR2}$ ... $R_{SRn}$ of the respective pixels $P_1$, $P_2$ ... $P_n$.

For example, the short-circuit preventing resistors $R_{SR1}$, $R_{SR2}$ ... $R_{SRn}$ may be added by electrically separating the auxiliary electrodes 122 and the first electrodes 124 from each other in each pixel of the lighting device 100 having a structure as shown in FIG. 1 and then adding a separate resistive pattern thereto.

Figure 6:
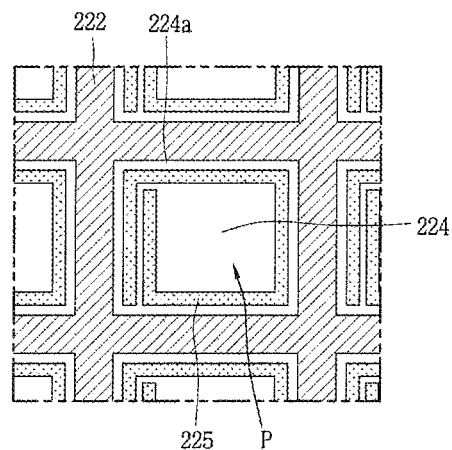
FIG. 6 shows an example of a structure of a lighting device having a short-circuit preventing resistor by forming a separate pattern in a pixel according to an embodiment.

FIG. 6 shows an example of a structure of a lighting device provided with a short-circuit preventing resistor by forming a separate pattern in a pixel according to an embodiment.

As shown in FIG. 6, the first electrode 224 may be spaced apart from the auxiliary electrode 222 by a certain distance in the pixel P partitioned by the auxiliary electrode 222. The auxiliary electrode 222 and the first electrode 224 are electrically connected to each other by a resistive pattern 224a that is a conductive pattern having relatively high resistance.

In the lighting device 100 having such a structure, a signal applied to the auxiliary electrode 222 may be applied to the first electrode 224 via the resistive pattern 224a. Accordingly, it is possible to form the short-circuit preventing resistors $R_{SR1}$, $R_{SR2}$ ... $R_{SRn}$ each having a desired resistance value by forming the resistive pattern 224a to have a sufficiently long length (that is, making a path through which a signal flows long enough).

The drawings illustrate that the resistive pattern 224a is formed of the same material as the first electrode 224 by forming the first electrode 224 to cover an upper portion of the auxiliary electrode 222 and the entire lighting device, and forming an open region 225 to remove a portion of the first electrode 224. But, the resistive pattern 224a may be formed of the same material as or a different material from the first electrode 224 by a different process from the first electrode 224 after the first electrode 224 and the auxiliary electrode 222 are formed separately from each other.

However, the lighting device having a separate resistive pattern 224a as described above may not emit light in a region where the resistive pattern 224 is formed, and thus an aperture ratio of the lighting device (a ratio of the light emitting region) may be lowered.

In particular, the resistive pattern needs to be formed to have a predetermined width and length so as to form a predetermined resistance value. Accordingly, it is necessary to form the resistive pattern 224a to have a certain area in the pixel, regardless of an area of the pixel.

For this reason, the resistive pattern 224a may lower an aperture ratio of a high resolution lighting device having a small pixel size to a predetermined value or less, and thus the lighting device may become defective. Therefore, when the short-circuit preventing resistors $R_{SR1}$, $R_{SR2}$ ... $R_{SRn}$ are formed by the resistive pattern 224a, the aperture ratio of the pixel is lowered, making it impossible to manufacture a high resolution lighting device.

According to embodiments, the short-circuit preventing resistors $R_{SR1}$, $R_{SR2}$ ... $R_{SRn}$, may be formed in each pixel by using the first electrode 124 formed of a conductive material having high resistance without the need to have a separate resistive layer or resistive pattern. As described above, since a separate resistive layer or resistive pattern is not provided according to embodiments, it is possible to solve such problems of the addition of a process, the lowered aperture ratio, and the high resolution lighting device being not able to be manufactured.

The high resistance transparent conductive material used for the first electrode 124 according to the embodiments may be set to have a resistance value of about 2,800-5,500Ω in one pixel, and thereby it is possible to prevent defects of the lighting device 100 caused by the short-circuit of the pixels even when the first electrode is contact with the second electrode. According to the embodiments, any material may be used as the high resistance transparent conductive material as long as it is a transparent conductive material having a resistance value of the aforementioned range. For example, a conductive polymer, a carbon based material, a nanowire based material, and the like may be used.

Figure 7A:
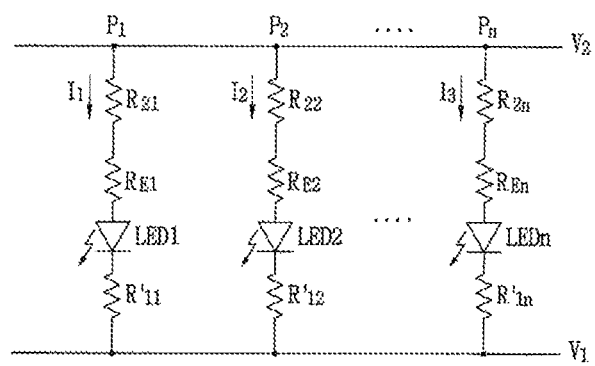
FIGS. 7A and 7B each show a circuit of an organic light emitting diode in which a first electrode is formed of a high resistance conductive material according to an embodiment.
Figure 7B:
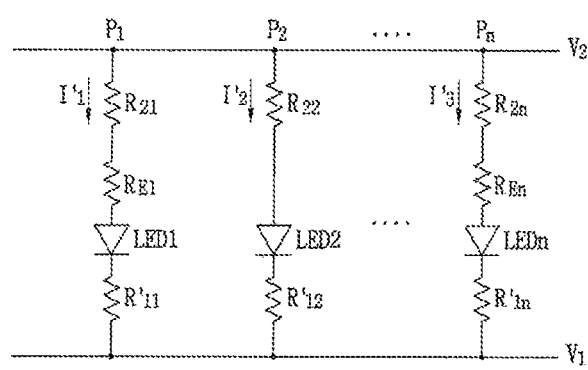

FIGS. 7A and 7B each shows a circuit of an organic light emitting diode in which a first electrode is formed of a high resistance conductive material according to an embodiment.

As shown in FIG. 7A, the resistors $R_{E1}$, $R_{E2}$ ... $R_{En}$ of the organic light emitting layer 130, the resistors $R_{11}$, $R_{12}$ ... $R_{1n}$ of the first electrode 124 and the resistors $R_{21}$, $R_{22}$ ... $R_{2n}$ of the second electrode 126 may be respectively connected to the plurality of pixels connected to each other in parallel, in serial. Here, the resistors $R_{21}$, $R_{22}$ ... $R_{2n}$ of the second electrode 126 formed of metal such as Ca, Ba, Mg, Al and Ag, or an alloy thereof each may have a resistance value of about 0.1Ω, the resistors $R_{E1}$, $R_{E2}$ ... $R_{En}$ of the organic light emitting layer 130 each may have an resistance value of 1 MΩ, and the resistors $R_{11}$, $R_{12}$ ... $R_{1n}$ of the first electrode 124 formed of a high resistance conductive material such as, for example, a conductive polymer, a carbon based material, a nanowire based material, or the like each may have a resistance value of 2,800-5,500Ω.

The organic light emitting diode shown in FIG. 4A, that is, the organic light emitting diode having a separate resistive layer or resistive pattern is provided with a separate short-circuit preventing resistor, whereas the organic light emitting diode having a high resistance conductive material shown in FIG. 7A is not provided with a separate short-circuit preventing resistor since the first electrode 124 having high resistance may serves as the short-circuit preventing resistor.

In the organic light emitting diode having such a structure, the voltages $V_1$ and $V_2$ may be applied to the first electrode 124 and the second electrode 126, respectively, so that the currents $I_1$, $I_2$ ... $I_n$ may be applied to the organic light emitting layers $LED_1$, $LED_2$ ... $LED_n$ of the respective pixels $P_1$, $P_2$ ... $P_n$ to cause the organic light emitting layers $LED_1$, $LED_2$ ... $LED_n$ to emit light. Here, the plurality of pixels may have substantially the same resistance, so that the plurality of pixels may emit light having substantially the same luminance. As a result, the lighting device may output uniform light.

As shown in FIG. 7B, when the first electrode 124 and the second electrode 126 of one pixel $P_2$ of the plurality of pixels $P_1, P_2 \ldots P_n$ of the organic light emitting diode are in contact with each other, the resistor $R_{E2}$ of the organic light emitting layer 130 may be removed from the corresponding pixel, and only the resistor $R_{12}$ ($SR_2$) of the high resistance conductive material of the first electrode 124 and the resistor $R_{22}$ of the second electrode 126 may remain therein.

The resistors $R_{11}$ ($SR_1$), $R_{12}$ ($SR_2$) . . . $R_{1n}$ ($SR_n$) of the first electrode 124 each may have a resistance value of about 2,800-5,500Ω, and the resistors $R_{E1}$, $R_{E2}$ . . . $R_{En}$ of the organic light emitting layer 130 each may have a resistance value of about 1 MΩ. Hence, even when the resistor $R_{E2}$ of the organic light emitting layer 130 of the second pixel $P_2$ is removed by the contact between the first electrode 124 and the second electrode 126, the resistor $R_{12}$ ($SR_2$) of the high resistance conductive material of the first electrode 124 may remain in the short-circuited second pixel $P_2$. The resistance of the resistor $R_{12}$ ($SR_2$) is not negligibly low in comparison to the total resistance of the other pixels $P_1 \ldots P_n$.

Therefore, when the first electrode 124 and the second electrode 126 of the pixel $P_2$ are in contact with each other and the second pixel $P_2$ is short-circuited, the resistor $R_{E2}$ of the organic light emitting diode of the second pixel $P_2$ may be removed and the resistance value of the organic light emitting diode may become zero. Thus, the total resistance $R_{t2}$ of the second pixel $P_2$ may have substantially the same resistance as the resistor $R_{12}$ ($SR_2$) of the first electrode 124 ($R_{t2} \approx R_{12}(SR_2)$).

But, the resistor $R_{12}$ ($SR_2$) of the first electrode 124 may have a significant degree of resistance in comparison to the resistor $R_{E2}$ of the organic light emitting layer 130. Therefore, a current between the first electrode 124 and the second electrode 126 may not flow mostly through the pixel $P_2$, but a certain amount of current $I_2$, may flow through the pixel $P_2$. Here, although the amounts of currents flowing through the second pixel $P_2$ and the other pixels $P_1 \ldots P_n$ differ from each other due to a difference in total resistance between the second pixel P2 and the other pixels $P_1 \ldots P_n$, the current may flow through all the pixels $P_1, P_2 \ldots P_n$. Thus, it is possible to prevent a phenomenon that the organic light emitting layers of the plurality of pixels $P_1, P_2 \ldots P_n$ each have sharply lowered luminance or emit no light.

In particular, according to embodiments, it is possible to prevent a short-circuit of the pixels $P_1, P_2 \ldots P_n$ even when a separate resistive layer is not provided, so that it is possible to prevent an increase in costs or a decrease in yield resulting from the addition of a process.

Moreover, it is possible to prevent a short-circuit of the pixels $P_1, P_2 \ldots P_n$ even when a separate resistive pattern is not provided, so that it is possible to prevent a decrease in the aperture ratio of the lighting device.

For example, in a lighting device having a pixel size of 500×500 μm2, a structure having a resistive pattern has an aperture ratio of about 84.1% whereas a structure in which the first electrode is formed of a high resistance transparent conductive material according to embodiments has an aperture ratio of about 93.3%. That is, the aperture ratio of the lighting device according to embodiments has been improved by about 9% in comparison to the lighting device having a resistive pattern.

In a lighting device having a pixel size of 300×300 μm2, a structure having a resistive pattern has an aperture ratio of about 74.1% whereas a structure in which the first electrode is formed of a high resistance transparent conductive material according to embodiments has an aperture ratio of about 89%. That is, the aperture ratio of the lighting device according to embodiments has been improved by about 15% in comparison to the lighting device having a resistive pattern.

As described above, the structure according to embodiments may have an improved aperture ratio in comparison to the structure having a resistive pattern. A high resolution lighting device having a small pixel size may exhibit an aperture ratio improvement degree more apparently.

In a lighting device having a pixel size of 200×200 μm2, a structure having a resistive pattern has an aperture ratio of about 62.1% whereas a structure in which the first electrode is formed of a high resistance transparent conductive material according to embodiments has an aperture ratio of about 83.7%. Accordingly, the structure according to embodiments may be applied to the lighting device having a pixel size of 200×200 μm2, but the structure having a resistive pattern may not be applied thereto due to a decrease in the aperture ratio.

The light scattering particles 125 may be dispersed in the first electrode 124 to scatter light emitted from the organic light emitting layer 130.

In general, a refractive index difference between adjacent layers at an interface between the organic light emitting layer 130 and the first electrode 124, an interface between the first electrode 124 and the first substrate 110 and/or an interface between the first substrate 110 and an outer air layer causes the light emitted from the organic light emitting layer 130 not to pass through the interfaces and to be reflected, and the reflected light is guided inside the first electrode 124 and the first substrate 110 and propagated side surfaces of the first electrode 124 and the first substrate 110.

About 80% of the light emitted from the organic light emitting layer 130 is generally reflected at an interface of each layer, and only 20% of the light is output to the outside. Such light loss lowers light efficiency, power efficiency and a lifespan of the lighting device.

But, according to embodiments, the light scattering particles 125 may be dispersed in the first electrode 124 to reduce a refractive index difference between the first electrode 124 and the first substrate 110, thereby reducing light reflection occurring at the interface between the first electrode 124 and the first substrate 110.

The first electrode 124 formed of a transparent metal oxide such as ITO or IZO which is generally used may have a refractive index of about 1.9, and the first substrate 110 formed of glass may have a refractive index of about 1.5. On the other hand, accordingly to embodiments, the light scattering particles 125 may be dispersed in the high resistance transparent conductive material, and thus the refractive index of the first electrode 124 may be reduced to about 1.65. In other words, the refractive index difference at the interface between the first electrode 124 and the first substrate 110 may be reduced by the light scattering particles 125, so that the light reflection at the interface may be reduced. As a result, an amount of light that passes through the first electrode 124 may be increased.

As the light scattering particles 125, a high refractive light scattering particle may be used. Although any material may be used as the high refractive index scattering particle as long as it has a predetermined refractive index, $TiO_2$, $BaTiO_3$, $ZrO_2$, ZnO, $SiO_2$, SiO and the like may be used according to embodiments.

As described above, according to embodiments, the first electrode 124 may be formed of a high resistance transparent conductive material, and thus the pixels may not be short-circuited even when the first electrode 124 and the second electrode 126 are in contact with each other. The light scattering particles 125 may be included in the first electrode 124 to reduce a refractive index difference between the first electrode 124 and the first substrate 110, and accordingly the light reflection occurring at the interface between the first electrode 124 and the first substrate 110 may be reduced, thereby improving the light efficiency of the lighting device.

Furthermore, according to embodiments, the light efficiency may be improved even when a separate layer to extract light is not provided, thereby preventing an increase in manufacturing costs or an increase in the thickness of the lighting device resulting from the addition of a manufacturing process.

Figure 8:
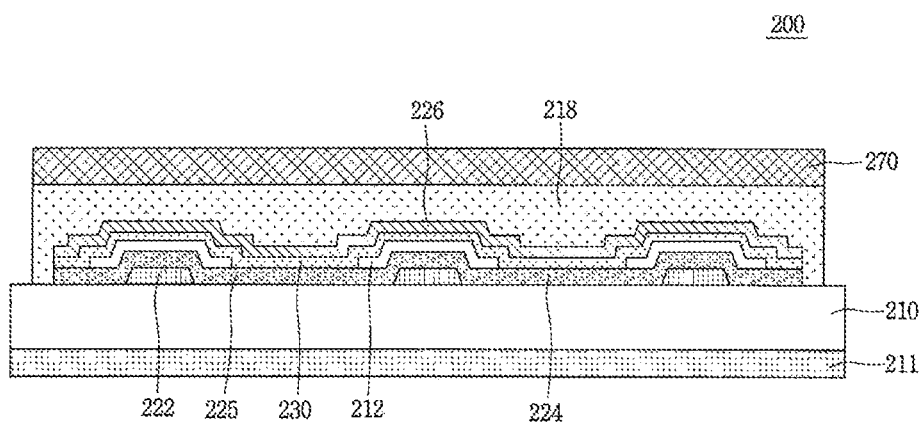
FIG. 8 is a cross-sectional view of a lighting device according to a second embodiment.

FIG. 8 is a cross-sectional view of a lighting device 200 according to a second embodiment.

The lighting device 200 shown in FIG. 8 is the same as the lighting device 100 shown in FIG. 1B in terms of a configuration except an outer extracting layer. The description of the same configuration will be simplified, and only the different configuration will be described in detail.

As shown in FIG. 8, an organic light emitting diode including a first electrode 224, an organic light emitting layer 230 and a second electrode 226 may be arranged on an upper surface of the first substrate 210. The first electrode 224 may be formed of a high resistance transparent conductive material having high refractive light scattering particles 225 dispersed therein.

A light extracting layer 211 may be formed on a lower surface of the first substrate 210, that is, on a surface of the first substrate 210 opposite to the organic light emitting diode. The light extracting layer 211 may be arranged at an interface between the first substrate 210 and an outer air layer to reduce light reflection occurring at the interface between the first substrate 210 and the outer air layer, thereby improving the extraction efficiency of light emitted from the organic light emitting layer 230.

The light extracting layer 211 may be configured in various forms. For example, the light extracting layer 211 may be formed of a plurality of layers. The plurality of light extracting layers 211 may have a gradually reduced refractive index toward the outer air layer from the first substrate 210 to reduce the angle of light totally reflected at an interface between the light extracting layer 211 and the outer air layer, thereby improving the light efficiency.

Also, the light extracting layer 211 may include light scattering particles to scatter incident light at the interface between the light extracting layer 211 and the outer air layer, thereby minimizing the light reflected at the interface between the light extracting layer 211 and the outer air layer.

Substantially, the light extracting layer 211 may have all known structures as long as it is possible to improve the light extracting efficiency by minimizing the reflection of incident light at the interface between the light extracting layer 211 and the outer air layer.

As described above, in the lighting device according to embodiments, the first electrode 224 may have high refractive light scattering particles to minimize light reflection occurring at an interface between the first electrode 224 and the first substrate 210, thereby improving the light efficiency. Furthermore, the light extracting layer 211 may be formed on the surface of the first substrate 210 in contact with the outer air layer to minimize light reflection occurring at the interface between the first substrate 210 and the outer air layer, thereby further improving the light efficiency.

Hereinafter, a manufacturing method of the lighting device 100 according to embodiments will be described in detail with reference to the accompanying drawings.

FIGS. 9A to 9D and FIGS. 10A to 10D show a method of manufacturing a lighting device 100 according to embodiments. FIGS. 9A to 9D are plan views of a lighting device 100, and FIGS. 10A to 10D are cross-sectional views of a lighting device 100.

Figure 9A:
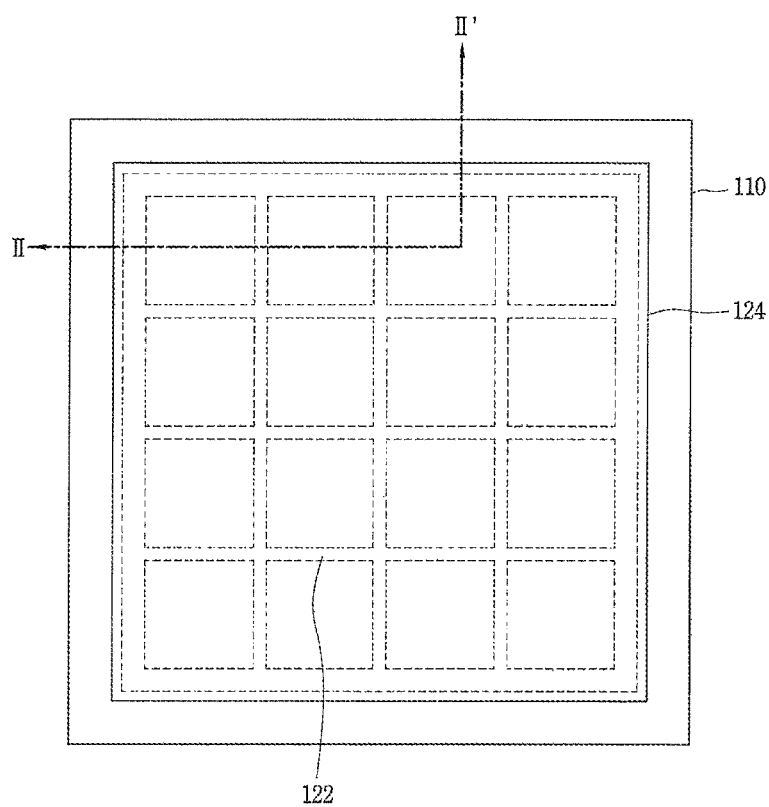
FIGS. 9A to 9D are plan views showing a method of manufacturing a lighting device according to an embodiment.
Figure 10A:
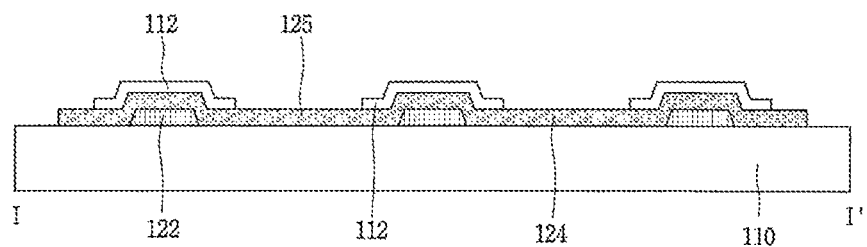
FIGS. 10A to 10D are cross-sectional views showing a method of manufacturing a lighting device according to an embodiment.

Firstly, as shown in FIGS. 9A and 10A, metal such as, for example, Al, Au, Cu, Ti, W, Mo, or an alloy thereof may be laminated and etched on a transparent first substrate 110 formed of a ductile material such as, for example, plastic or a rigid material such as, for example, glass to form a auxiliary electrode 122 having a single-layered structure or a multi-layered structure. Here, the auxiliary electrode 122 may be arranged in a matrix shape in which a predetermined strip shape is arranged in horizontal and vertical directions over the entire first substrate 110. But, the shape of the auxiliary electrode 122 is not limited to the matrix shape, and may have a mesh shape, a hexagonal shape, an octagonal shape, and a circular shape.

The auxiliary electrode 122 may be formed to have a width of about 45-55 μm. However, the width of the auxiliary electrode 122 is not limited to a width having a particular value, but may vary according to a size of the lighting device, a size of the pixel, a material of the auxiliary electrode 122, and the like. The auxiliary electrode 122 may define a plurality of pixels or pixel regions on the first substrate 110.

Thereafter, about 10-30 wt. % of a conductive polymer such as, for example, poly (3,4-ethylenedioxythiophene): polystyrenesulfonic acid (PEDOT:PSS) may be melted in about 70-95 wt. % of a solvent such as, for example, propylene glycol monomethylethylether acetate (PGMEA), and then the molten conductive polymer may be mixed with about 10-30 wt. % of a silicon based binder such as, for example, tetraethlyorthosilicate (TEOS), silsesquioxane (SSQ) and polysiloxane or an acrylic binder, and then 1 wt. % or less of an addictive such as, for example, a leveler and surfacer may be added to the molten conductive polymer.

Subsequently, one or more types of high refractive light scattering particles such as, for example, $TiO_2$, $BaTiO_3$, $ZrO_2$, $ZnO$, $SiO_2$, $SiO$ and the like may be mixed and contained in the melted conductive polymer. Here, the high refractive light scattering particles may be randomly dispersed such that the volume thereof is about 40-60% with respect to the total molten conductive polymer.

Also, a high resistance transparent conductive material may be formed by melting about 10-30 wt. % of a carbon based material such as, for example, grapheme, a single wall carbon nano tube (SWCNT) and a multi wall carbon nano tube (MWCNT) in about 70-95 wt. % of a solvent such as, for example, PGMEA, mixing a silicon based binder such as, for example, polysiloxane, or acrylic binder with the molten carbon based material, and adding 1 wt. % or less of an additive such as, for example, a leveler and a surface to the molten carbon based material. Here, one or more types of high refractive light scattering particles such as, for example, $TiO_2$, $BaTiO_3$, $ZrO_2$, $ZnO$, $SiO_2$, $SiO$ and the like may be mixed and contained in the melted carbon based material. Here, the high refractive light scattering particles may be randomly dispersed such that the volume thereof is about 40-60% with respect to the total molten carbon based material.

And, a high resistance transparent conductive material may be formed by melting about 10-30 wt. % of a nanowire based material such as, for example, Cu-nanowires, Ag-nanowires, and Au-nanowires in about 0-95 wt. % of a solvent such as, for example PGMEA, mixing about 10-20 wt. % of a silicon based binder such as, for example, TEOS, SSQ and polysiloxane or an acrylic binder with the molten nanowire based material, and adding 1 wt. % or less of an additive such as, for example, a leveler and a surface to the molten nanowire based material. Here, one or more types of high refractive light scattering particles such as, for example, $TiO_2$, $BaTiO_3$, $ZrO_2$, ZnO, $SiO_2$, SiO and the like may be mixed and contained in the molten nanowire based material. Here, the high refractive light scattering particles may be randomly dispersed such that the volume thereof is about 40-60% with respect to the total molten nanowire based material.

The high resistance transparent conductive material having the high refractive light scattering particles 125 dispersed therein, which is formed through the aforementioned process, may be laminated and etched over the entire first substrate 110 including an upper surface of the auxiliary electrode 122. Here, the first electrode 124 may have a different thickness depending on a type of the conductive material. For example, when the conductive polymer is used as the conductive material, the first electrode 124 may be formed to a thickness of about 150-200 nm. When the carbon based material is used as the conductive material, the first electrode 124 may be formed to have a thickness of about 50-100 nm.

Thereafter, an inorganic insulating material or an organic insulating material may be laminated and etched on the first electrode 124 to form a protective layer 112 on the first electrode 124 arranged on the auxiliary electrode 122. Here, the protective layer 112 may be formed of a single layer of an inorganic insulating layer or an organic insulating layer, but also may be formed of a plurality of layers of an inorganic insulating layer and an organic insulating layer.

Figure 9B:
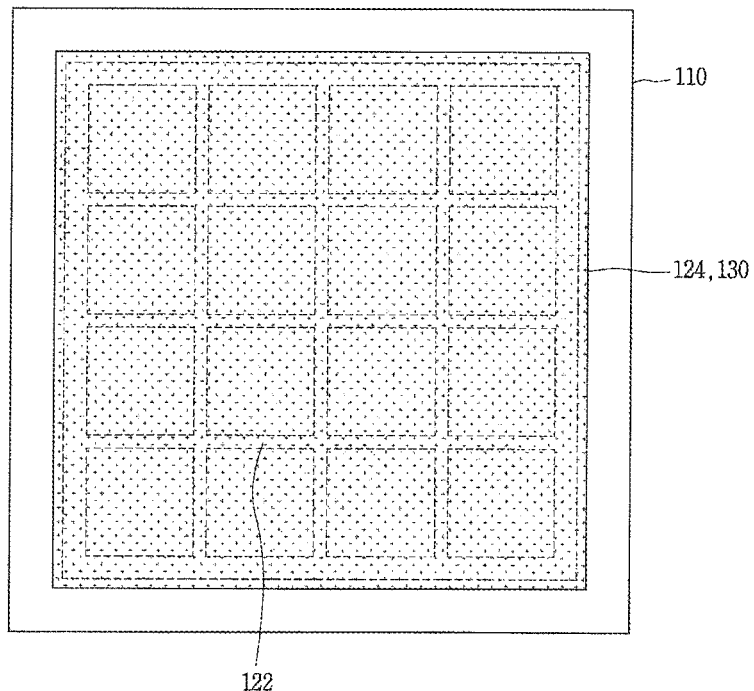
Figure 10B:
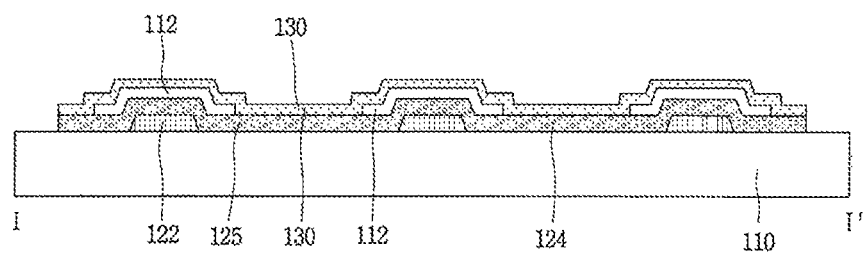

Next, as shown in FIGS. 9B and 10B, an organic light emitting material may be deposited on the first substrate 110 to form an organic light emitting layer 130. Here, the organic light emitting layer 130 may be formed by arranging a mask on a mother substrate on which a plurality of lighting devices are formed, and then depositing an organic light emitting material.

Figure 9C:
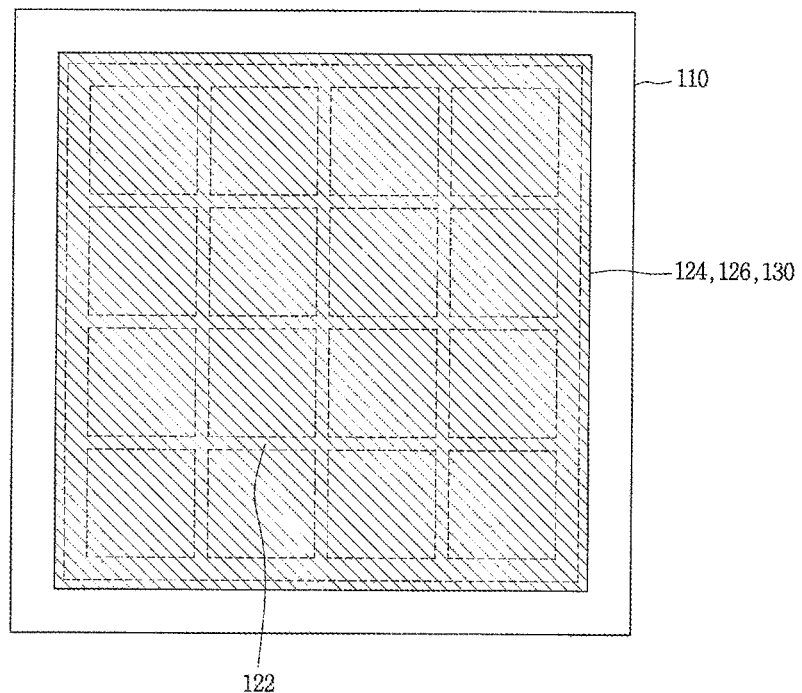
Figure 10C:
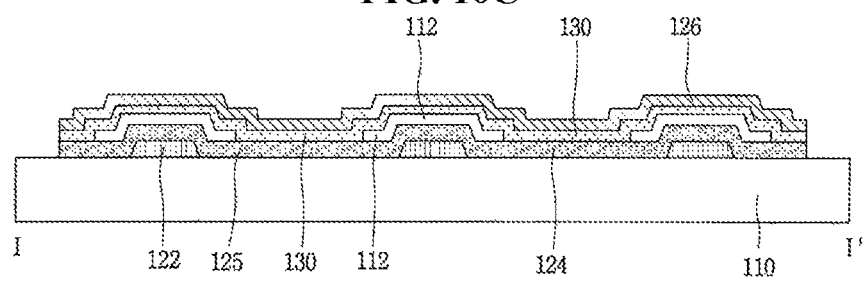

Next, as shown in FIGS. 9C and 10C, metal such as Ca, Ba, Mg, Al or Ag may be deposited and etched on the organic light emitting layer 130 to form a second electrode 126.

Figure 9D:
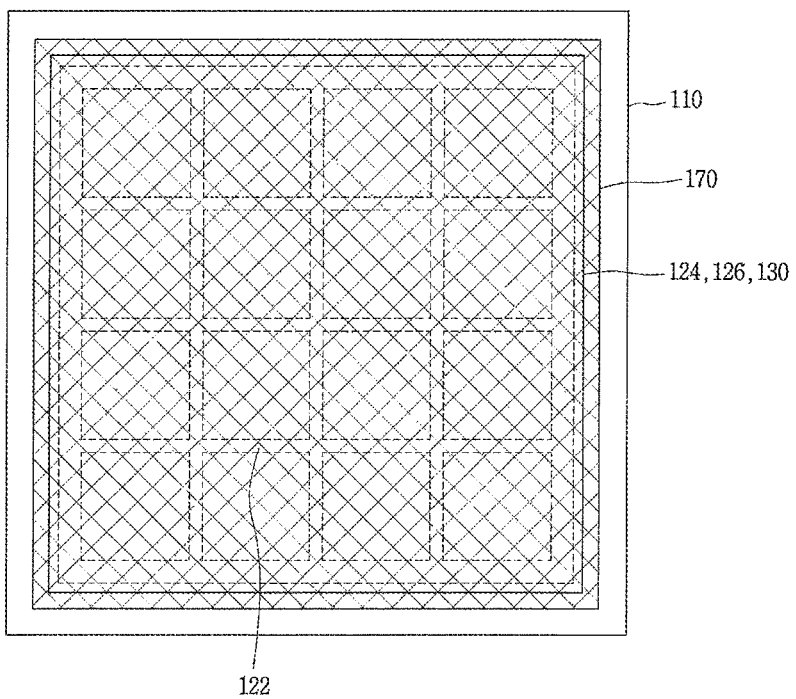
Figure 10D:
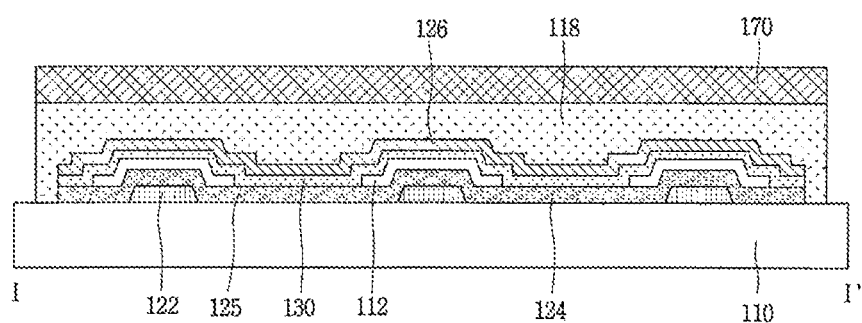

Thereafter, as shown in FIGS. 9D and 10D, an adhesive 118 formed of a photo-curable adhesive material or a thermo-curable adhesive material may be applied on the first substrate 110, and a second substrate 170 may be placed thereon. After attaching the second substrate 170 to the first substrate 110 by curing the adhesive 118, the first and second substrates 110 and 170 joined together may be cut to complete a lighting device 100. The completed lighting device 100 may be separated into a plurality of lighting devices 100. As the second substrate 170, a polymer film such as, for example, PET, a thin metal foil, glass, or the like may be used.

As described above, the first electrode formed of a high resistance transparent conductive material according to embodiments may serve as a short-circuit preventing resistor even when a separate resistive layer or resistive pattern is not provided, and thereby it is possible to prevent defects resulting from a short-circuit of the organic light emitting diode even when the first electrode and the second electrode are in contact with each other.

Also, since a separate resistive layer is provided, it is possible to prevent an increase in costs or a decrease in yield resulting from the addition of a process. Furthermore, since no separate resistive pattern is provided, it is possible to prevent a decrease in the aperture ratio of the lighting device. In particular, the first electrode formed of the high resistance transparent conductive material may be usefully employed for high resolution lighting device having a pixel size of 300×300 µm2 or less.

The present disclosure described as above is not limited by the embodiments described herein and accompanying drawings. It should be apparent to those skilled in the art that various substitutions, changes and modifications which are not exemplified herein but are still within the spirit and scope of the present disclosure may be made. The embodiments should be considered in descriptive sense only and not for purposes of limitation.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A lighting device, comprising:
   a first substrate including a plurality of pixels;
   an auxiliary electrode arranged on the first substrate and connected to the first electrode, wherein the auxiliary electrode is arranged in a matrix shape and the pixel is partitioned by the auxiliary electrode;
   an organic light emitting diode on the first substrate, the organic light emitting diode including a first electrode, an organic light emitting layer, and a second electrode, the organic light emitting diode being divided into the plurality of pixels, each of the pixels having a respective light emitting region, and
   a resistive pattern formed by an open region to remove a portion of the first electrode,
   wherein the first electrode is spaced apart from the auxiliary electrode by a certain distance in the pixel, and the auxiliary electrode and the first electrode are electrically connected to each other by the resistive pattern, and
   wherein the first electrode includes a transparent conductive material and light scattering particles.

2. The light device of claim 1, wherein
   the transparent conductive material includes indium tin oxide (ITO) or indium zinc oxide (IZO).

3. The light device of claim 1, wherein
   the light scattering particles include at least one material selected from a group consisting of $TiO_2$, $BaTiO_3$, $ZrO_2$, ZnO, $SiO_2$, and SiO.

4. The lighting device of claim 1, wherein
   the light scattering particles reduce a refractive index between the first electrode and the first substrate.

5. The lighting device of claim 1, wherein
   the resistive pattern is formed of a same material as the first electrode.

* * * * *